United States Patent
Lee

[19]

[11] Patent Number: 6,001,683
[45] Date of Patent: Dec. 14, 1999

[54] FORMATION METHOD OF INTERCONNECTION IN SEMICONDUCTOR DEVICE

[75] Inventor: Sang-in Lee, Suwon, Rep. of Korea

[73] Assignee: Samsung Electronics Co., Ltd., Suwon, Rep. of Korea

[21] Appl. No.: 08/655,122

[22] Filed: May 28, 1996

[30] Foreign Application Priority Data

Nov. 2, 1995 [KR] Rep. of Korea ...................... 95-39443

[51] Int. Cl.$^6$ .............................................. H01L 21/8242
[52] U.S. Cl. .................... 438/241; 438/598; 438/599; 438/618; 438/253
[58] Field of Search ..................... 438/253, 396, 438/241, 598, 599, 128, 129, 618, 621, 640

[56] References Cited

U.S. PATENT DOCUMENTS

| | | | |
|---|---|---|---|
| 5,275,963 | 1/1994 | Cederbaum et al. ..................... | 438/624 |
| 5,279,983 | 1/1994 | Ahn ......................................... | 438/241 |
| 5,286,677 | 2/1994 | Wu .......................................... | 438/241 |
| 5,366,906 | 11/1994 | Wojnarowski et al. ................. | 438/598 |
| 5,386,382 | 1/1995 | Ahn ......................................... | 438/598 |
| 5,395,784 | 3/1995 | Lu et al. .................................. | 438/241 |
| 5,504,029 | 4/1996 | Murata et al. .......................... | 438/241 |
| 5,529,945 | 6/1996 | Rao ......................................... | 438/253 |
| 5,550,072 | 8/1996 | Cacharelis et al. ..................... | 438/241 |
| 5,612,241 | 3/1997 | Arima ...................................... | 438/241 |
| 5,620,917 | 4/1997 | Yoon et al. .............................. | 438/253 |
| 5,719,089 | 2/1998 | Cherng et al. .......................... | 438/637 |
| 5,766,992 | 6/1998 | Chou et al. ............................. | 438/241 |
| 5,780,334 | 7/1998 | Lim et al. ............................... | 438/253 |
| 5,780,337 | 7/1998 | Huang ..................................... | 438/253 |
| 5,783,496 | 7/1998 | Flanner et al. .......................... | 438/743 |
| 5,804,479 | 9/1998 | Aoki et al. .............................. | 438/253 |
| 5,840,621 | 11/1998 | Kasai ...................................... | 438/622 |

*Primary Examiner*—John F. Niebling
*Assistant Examiner*—Lynne A. Gurley
*Attorney, Agent, or Firm*—Jones, Volentine, Steinberg & Whitt, L.L.P.

[57] ABSTRACT

A method of forming an interconnection by using a landing pad is disclosed. In a semiconductor device having a memory cell portion and a peripheral circuit portion, a refractory metal is used for the bitline instead of the usual polycide, to concurrently form a contact on each active region of an N-type and a P-type, then a landing pad is formed on the peripheral circuit portion when a bitline is formed on the memory cell portion. In such a process, a substantial contact hole for the interconnection is formed on the landing pad so that an aspect ratio of the contact can be lowered. Accordingly, when forming a metal interconnection, the contact hole for the interconnection is easily filled by Al reflow so that the coverage-step of the metal being depositing in the contact hole for the interconnection is enhanced, the contact resistance is reduced. Further, the reliability of the semiconductor device is improved.

15 Claims, 9 Drawing Sheets

FORMATION METHOD OF INTERCONNECTION IN SEMICONDUCTOR DEVICE

BACKGROUND OF THE INVENTION

The present invention relates to a process for forming an interconnection in a semiconductor device, and relates more particularly, to a method of forming an interconnection in such a device by using a landing pad.

Interconnection technology in a semiconductor device can be divided into two steps, i.e., formation of a contact hole and formation of an interconnection. As a semiconductor device becomes highly-integrated, the width of the interconnection line becomes more narrow. When the horizontal size of the contact is reduced its vertical size is increased, which increases the aspect ratio of the contact. A metal interconnection needs to be multileveled to enable enhancing of the operation speed of a device and for reliability of the interconnection. Also, filling of a contact hole is essential for planarization of an interdielectric layer.

The filling techniques for filling contact holes in current multilevel interconnection formation processes consist mainly of either one of two methods. Such filling procedures usually involve either a physical vapor deposition method or a chemical vapor deposition (CVD) method.

The physical vapor deposition (PVD) method involves depositing in the contact hole a metal such as aluminum, for example, by sputtering. However, when the aspect ratio becomes increased by the reduction of a contact hole size to 1 $\mu$m or less, the coverage-step of a metal deposited on the contact hole is degraded.

The CVD method of filling a contact hole is advantageous for obtaining an excellent step-coverage characteristic. But, the CVD method still presents difficulties when the method involves depositing aluminum in the contact hole.

Accordingly, a new method for filling the contact hole has recently been proposed. The new method comprises the steps of depositing aluminum by sputtering at a temperature and then reflowing the deposited aluminum at a high temperature of 500° C.–550° C.

However, as the aspect ratio of the contact hole becomes increased due to high-integration of a semiconductor, such as to 256M DRAM and 1 G DRAM, it is difficult to fill the contact hole. This difficulty is present even when the new aluminum reflow method is used to fill the contact hole for the formation of the metal interconnection layer.

Accordingly, due to the difficulties in filling the contact holes, the step-coverage of the metal interconnection is degraded and the contact resistances are increased.

SUMMARY OF THE INVENTION

An object of the present invention is to provide a method of forming an interconnection using a landing pad for lowering an aspect ratio of a contact to permit an aluminum (Al) reflow process to be effectively applied to a contact which is horizontally narrow and vertically deep.

To accomplish the above object of the present invention, there is provided a method of forming an interconnection in a semiconductor device having a memory cell portion and a peripheral circuit portion, comprising the steps of:

a) forming an active region of the memory cell portion, forming an active region of the peripheral circuit portion and forming a gate electrode on a silicon substrate, and then depositing a first insulating film on the whole surface of the resultant structure;

b) forming a recess structure connected to the active region of the memory cell portion and a contact hole for landing pad formation connected to the active region of the peripheral circuit portion by etching the first insulating film;

c) depositing a metal film for ohmic contact on the whole surface of a resultant of the step b);

d) depositing a metal compound film for a diffusion barrier on the whole surface of a resultant of the step c);

e) depositing a metal material film on the whole surface of a resultant of the step d), followed by filling the recess structure and the contact hole for landing pad formation;

f) forming a bitline and a landing pad by eliminating from said substrate the metal compound film and the metal material film, except for the films in said recess structure and said contact hole, which are filled with said metal material film for bitline and landing pad formation;

g) depositing a second insulating film on the whole surface of a resultant of the step f);

h) forming a contact hole for interconnection by etching the second insulating film on the landing pad;

i) depositing a metal for interconnection on the whole surface of a resultant of the step h), followed by filling the contact hole for interconnection; and j) forming an interconnection by patterning the metal for interconnection.

A preferred method for forming an interconnection further comprises the steps of depositing spin-on glass (SOG) on the whole surface of the first insulating film and then eliminating the SOG and a part of the first insulating film by a full etchback method, after the step a) of depositing a first insulating film.

It is further preferable in the above mentioned process according to the invention to include a step of selectively forming an ohmic contact layer on the surface of the silicon substrate by reacting the metal film for ohmic contact with silicon and then stripping a non-reacted part of the metal film for ohmic contact, after the step c) of depositing a metal film for ohmic contact.

According to the method of forming an interconnection of the above-mentioned present invention, when the bitline of the memory cell portion is formed during manufacturing a memory device, in particular when manufacturing a DRAM, the landing pad is concurrently formed on the peripheral circuit portion. Such concurrent formation has the effect of reducing the thickness of an insulating film that can be obtained during a successive step of forming a contact hole for interconnection. Therefore, it is easy to etch the insulating film in forming the contact hole and a contact hole having a small aspect ratio can be formed on the landing pad.

The above mentioned process according to the invention makes it easier to fill the contact hole for interconnection by the Al reflow method when forming a metal interconnection layer. Further, the step-coverage of a metal deposited on the contact hole for interconnection is enhanced and contact resistance is reduced. Thus, the reliability of a semiconductor device is increased by producing by such a process.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

The above object and advantages of the present invention will become more apparent by describing in detail a preferred embodiment thereof with reference to the attached drawings.

A first embodiment of the present invention is illustrated by FIGS. 1 through 11, which are cross-sectional views of a memory cell portion in respective steps of a process for forming an interconnection in a semiconductor device according to an embodiment of the present invention. Also, an example of the second embodiment of the present invention is illustrated by FIGS. 12 through 22, which are cross-sectional views of a peripheral circuit portion in respective steps of a process for forming an interconnection in a semiconductor device.

Figure 1:
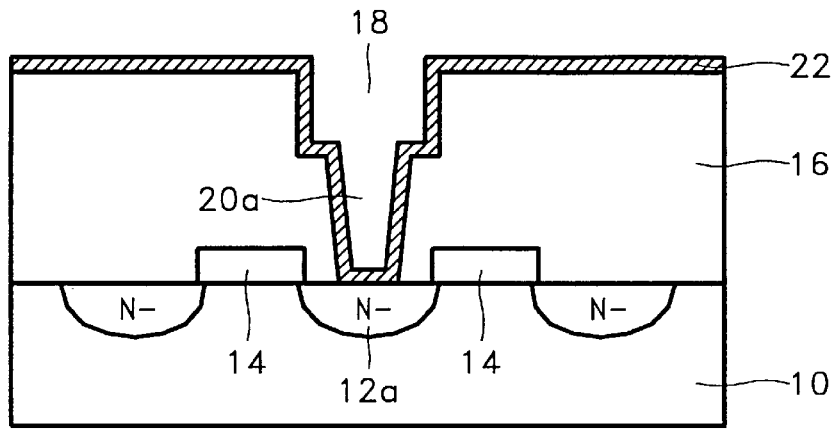
FIG. 1 is a cross-sectional view of a memory cell portion of a semiconductor device process substrate resulting from an interconnection process step, wherein a first insulating film has been etched to form a groove and a direct contact hole.
Figure 12:
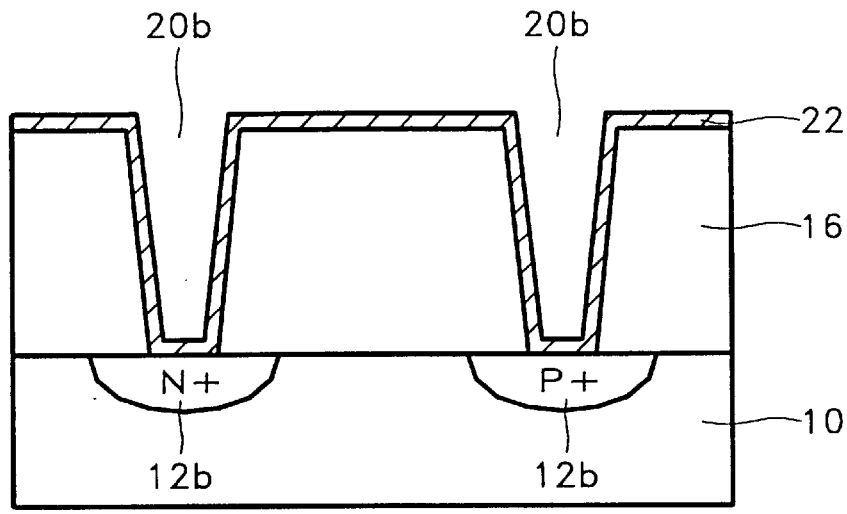
FIG. 12 is a cross-sectional view of a peripheral circuit portion of an active region of a memory cell portion of a semiconductor device process substrate resulting from an interconnection process step, wherein a first insulating film has been etched to form a contact hole for landing pad formation.

Referring to FIGS. 1 and 12, there is shown a cross section of a semiconductor device having a gate electrode 14, an active region 12a of a memory cell portion and an active region 12b of a peripheral circuit portion, i.e., source and drain regions are formed on a silicon substrate 10 in a usual manner. Also, the substrates shown in FIGS. 1 and 12 contain first insulating film layers 16 of, for example, borophospho-silicate glass (BPSG) or undoped $SiO_2$ glass (USG), which are deposited by chemical vapor deposition (CVD). The whole surface of the resultant structure is planarized by being coated with spin on glass (SOG), then planarized by eliminating the SOG and a part of first insulating film 16 by plasma full etchback. In such a process, the first insulating film can be planarized by chemical mechanical polishing (CMP).

Then, a bitline of the memory cell portion is formed by dual-damascene. The whole surface of the resultant structure is patterned reversely to the bitline patterning, then first insulating film 16 is etched to an approximately 0.4 μm depth in a usual manner, to thereby form a groove 18.

First insulating film 16 is re-etched by photolithography and etching so that a direct contact hole 20a is formed under groove 18 in order to be connected to an N-type active region 12a of the memory cell portion and at the same time a contact hole 20b for landing pad formation is formed in order to be connected to an N-type or P-type active region 12b of the peripheral circuit portion. Accordingly, a recess structure for the bitline of the memory cell portion consists of a direct contact hole 20a and groove 18. Then, a metal film 22 for ohmic contact is deposited with Ti on the whole surface of the resultant structure by using sputtering. In this case, the metal film 22 for ohmic contact can be formed of one or more of W, Mo, Ta or Zr.

Figure 2:
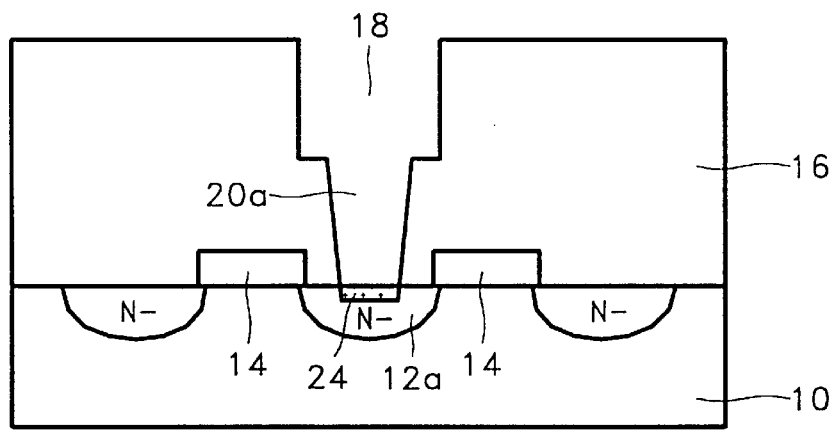
FIG. 2 is a cross-sectional view of a memory cell portion of a semiconductor device process substrate resulting from an interconnection process step, wherein an ohmic contact layer has been deposited in the contact hole.
Figure 13:
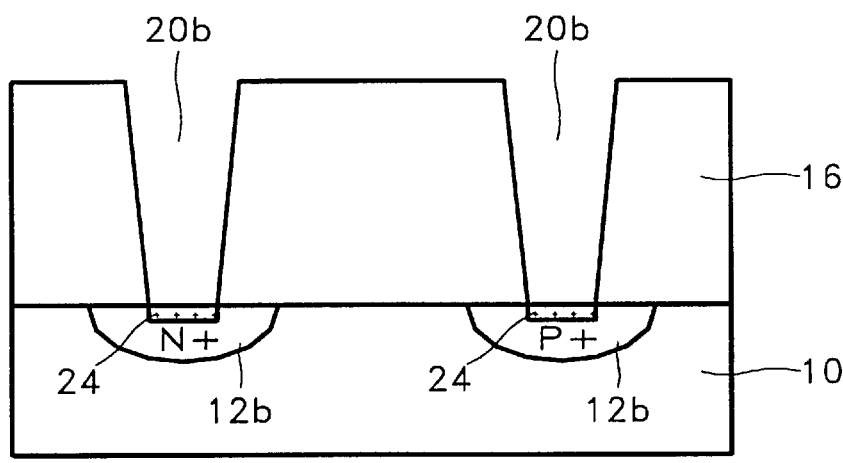
FIG. 13 is a cross-sectional view of a peripheral circuit portion of a semiconductor device process substrate resulting from an interconnection process step, wherein an ohmic contact layer has been deposited in the contact hole.

Referring to FIGS. 2 and 13, metal film 22 for ohmic contact, i.e., a Ti film is reacted with silicon on the surface of semiconductor substrate 10 under direct contact hole 20a and contact hole 20b for landing pad formation, to thereby selectively form a TiSi ohmic contact layer 24.

Subsequently, the resultant structure is thermally treated by rapid thermal annealing (RTA) in an $N_2$ or Ar atmosphere, for 10–30 seconds at 500° C.–700° C., then a non-reacted portion of Ti film 22 is stripped by sulfuric acid or other chemical solution.

TiSi ohmic contact layer 24 is thermally treated by RTA in an $N_2$ or Ar atmosphere, for 10–30 seconds at 700° C.–950° C. to be changed into $C54-TiSi_2$, which is stable and has high electrical conductivity.

Figure 3:
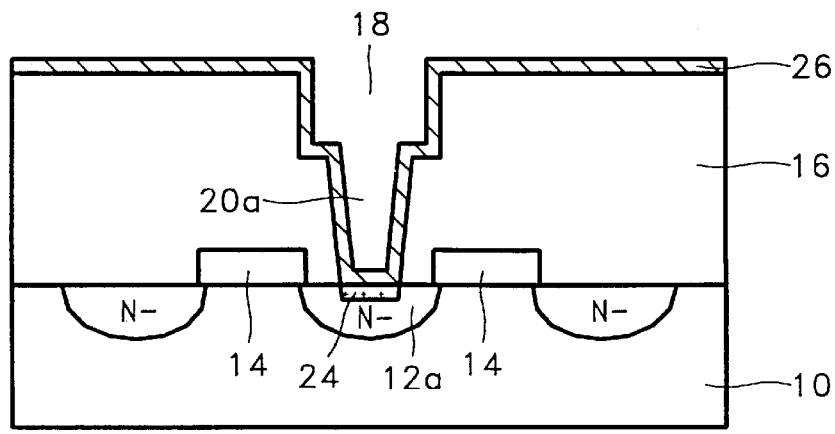
FIG. 3 is a cross-sectional view of a memory cell portion of a semiconductor device process substrate resulting from an interconnection process step, wherein a diffusion barrier film is deposited on the surface of the substrate including the surfaces of the contact hole and the ohmic layer.
Figure 14:
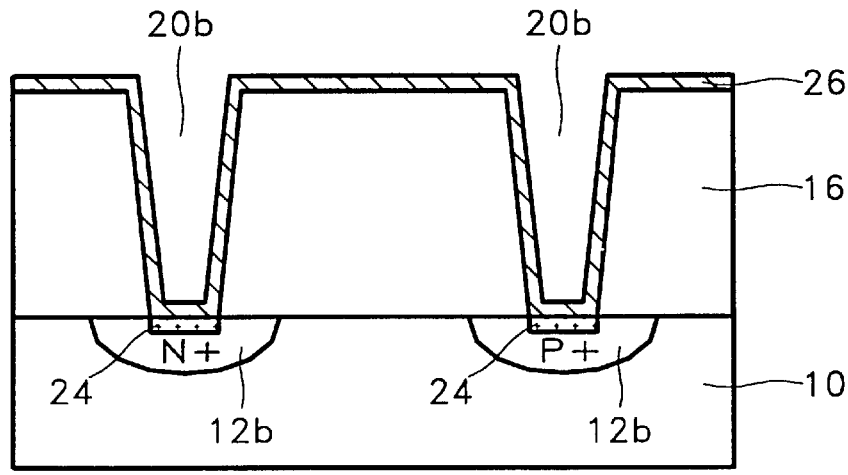
FIG. 14 is a cross-sectional view of a peripheral circuit portion of a semiconductor device process substrate resulting from an interconnection process step, wherein a diffusion barrier film is deposited on the surface of the substrate including the surfaces of the contact hole and the ohmic layer.

Referring to FIGS. 3 and 14, TiN is deposited on the whole surface of the resultant structure by reactive sputtering to a 200 Å–1,000 Å thickness, to thereby form a diffusion barrier film 26. Such a diffusion barrier film 26 can be formed of either a refractory metal nitride such as WN, TaN and ZrN, or a refractory metal carbide such as TiC, WC, TaC and ZrC.

Figure 4:
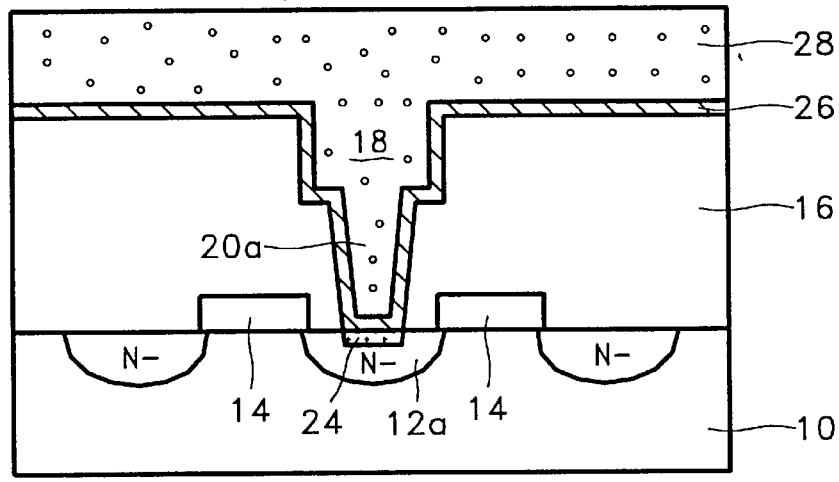
FIG. 4 is a cross-sectional view of a memory cell portion of a semiconductor device process substrate resulting from an interconnection process step, wherein a metal material film is deposited over the whole surface of the structure and also filling the contact hole.
Figure 15:
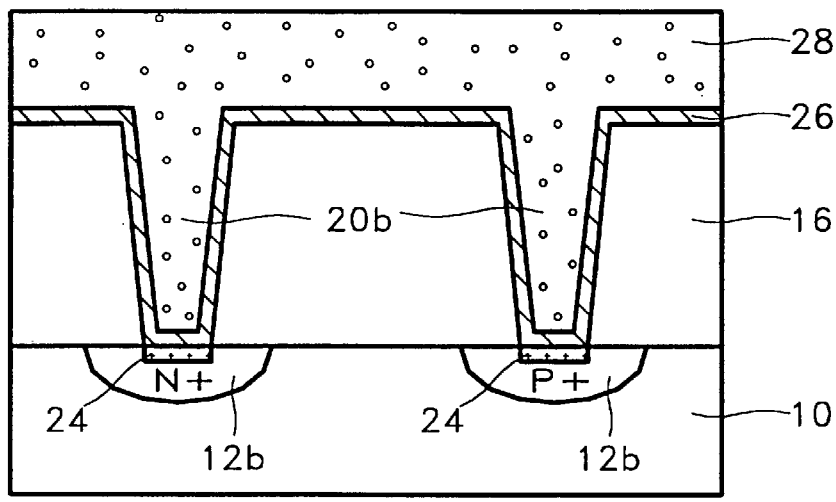
FIG. 15 is a cross-sectional view of a peripheral circuit portion of a semiconductor device process substrate resulting from an interconnection process step, wherein a metal material film is deposited over the whole surface of the structure and also filling the contact hole.

Referring to FIGS. 4 and 15, a metal material film 28 is formed by depositing a refractory metal such as W, Mo, Ta, Ti and Zr, which is not easily oxidized at a high temperature, on the whole surface of the resultant structure by CVD to a 1,000 Å–5,000 Å thickness.

The recess structure consisting of groove 18 and direct contact hole 20a, and contact hole 20b for landing pad formation are filled. In such a step, the refractory metal can be replaced with the refractory metal compound.

The refractory metal or the refractory metal compound such as the refractory metal nitride or the refractory metal carbide is used for forming the bitline, instead of usual polycide, so that a contact can be concurrently formed on active regions of an N-type and a P-type.

Figure 5:
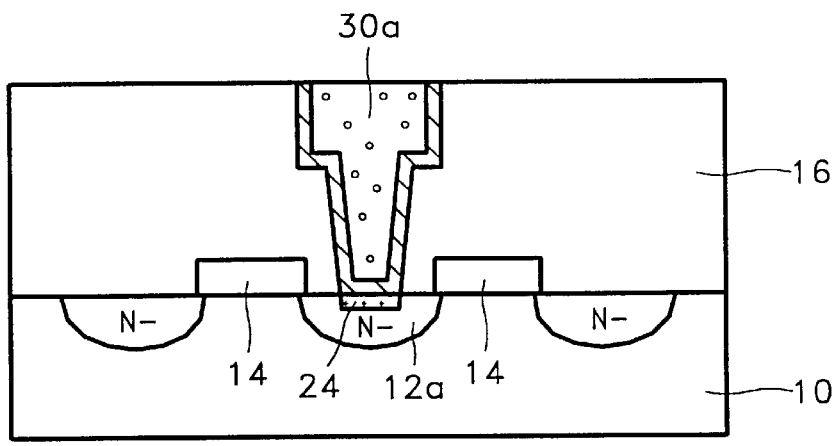
FIG. 5 is a cross-sectional view of a memory cell portion of a semiconductor device process substrate resulting from an interconnection process step, wherein a bitline has been formed in the substrate.
Figure 6:
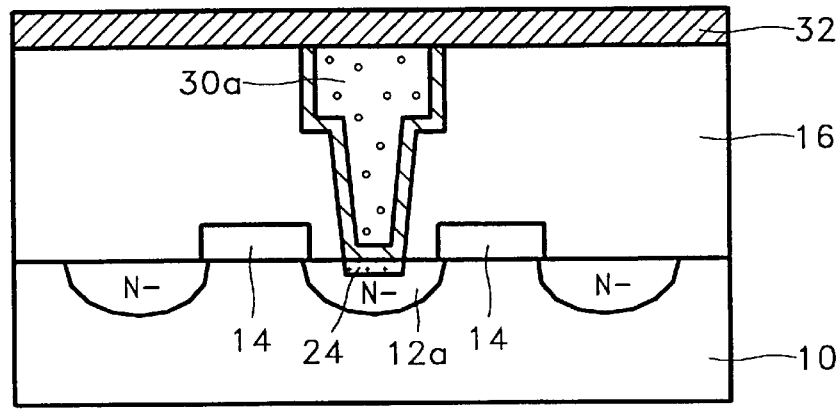
FIG. 6 is a cross-sectional view of a memory cell portion of a semiconductor device process substrate resulting from an interconnection process step, wherein a film layer has been formed on the surface of the substrate such that the bitline is also covered with the film layer.
Figure 16:
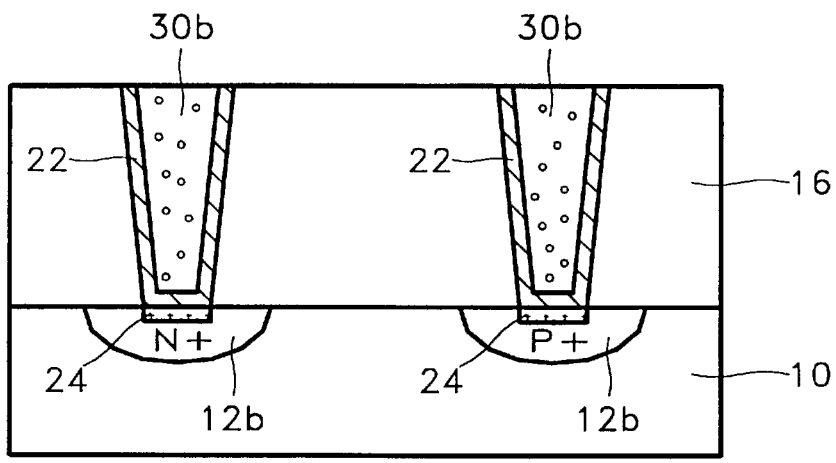
FIG. 16 is a cross-sectional view of a peripheral circuit portion of a semiconductor device process substrate resulting from an interconnection process step, wherein a landing pad has been formed in the substrate.
Figure 17:
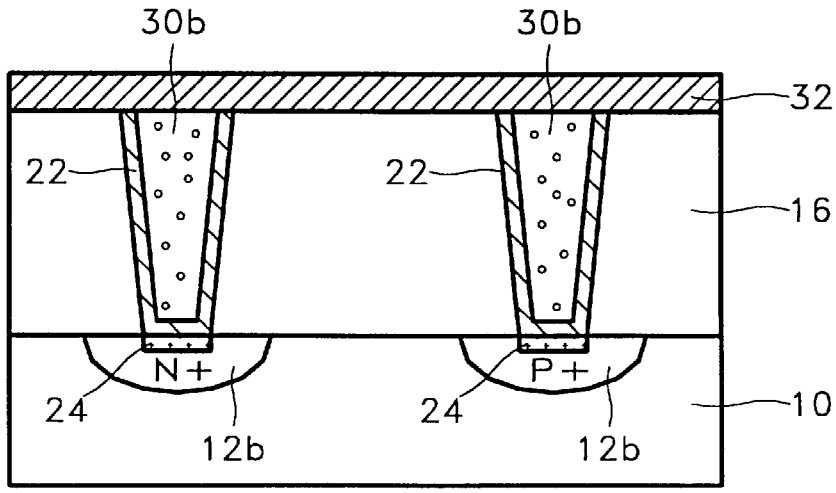
FIG. 17 is a cross-sectional view of a peripheral circuit portion of a semiconductor device process substrate resulting from an interconnection process step, wherein a SiN film layer has been formed on the surface of the substrate such that the landing pad is also covered with the film layer.

Referring to FIGS. 5 and 16, diffusion barrier film 26 and a metal material film 28 (except for the recess structure and the contact hole 20b for forming a filled landing pad and a bitline) are eliminated by chemical mechanical polishing (CMP) or plasma full etchback, to thereby form a bitline 30a and a landing pad 30b.

Figure 7:
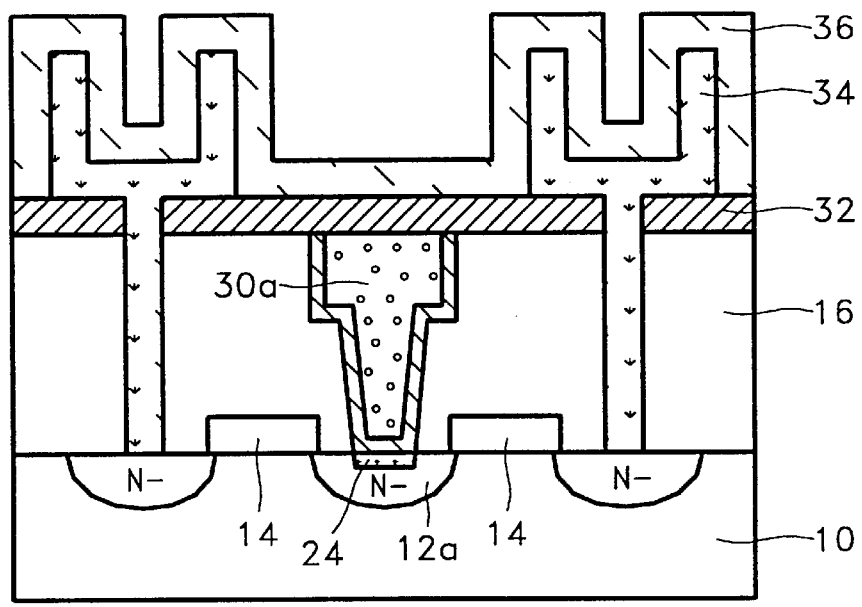
FIG. 7 is a cross-sectional view of a memory cell portion of a semiconductor device process substrate resulting from an interconnection process step, wherein an upper and lower electrode have been formed upon the film layer such that the lower electrode extends down through the film layer and the first the first insulating film layer, extending all the way down the silicon substrate layer.
Figure 18:
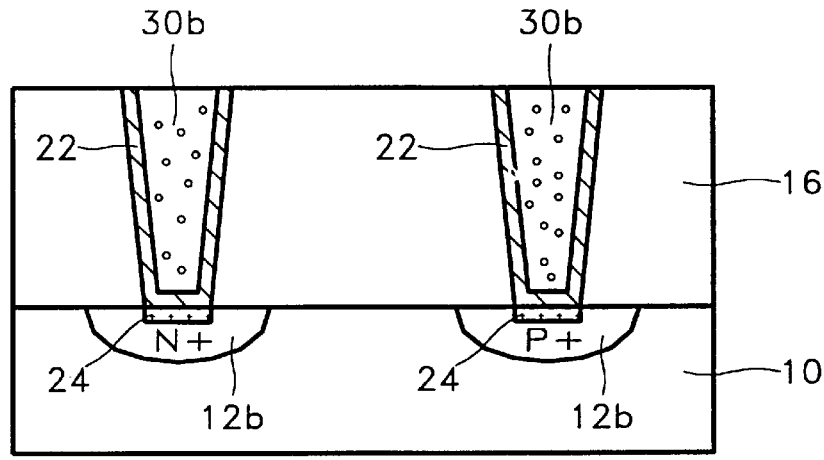
FIG. 18 is a cross-sectional view of a peripheral circuit portion of a semiconductor device process substrate resulting from an interconnection process step, wherein the SiN film of the peripheral portion of the substrate has been eliminated.

Referring to FIGS. 6, 7, 17, and 18, a SiN film 32 is formed on the whole surface of the resultant structure. As shown in FIG. 7, a lower electrode 34 of a capacitor, a $Ta_2O_5$ dielectric film (not shown) and an upper electrode 36 are formed on the memory cell portion in a usual capacitor formation method. The SiN film 32 of the peripheral portion is eliminated as shown in FIG. 18.

Figure 8:
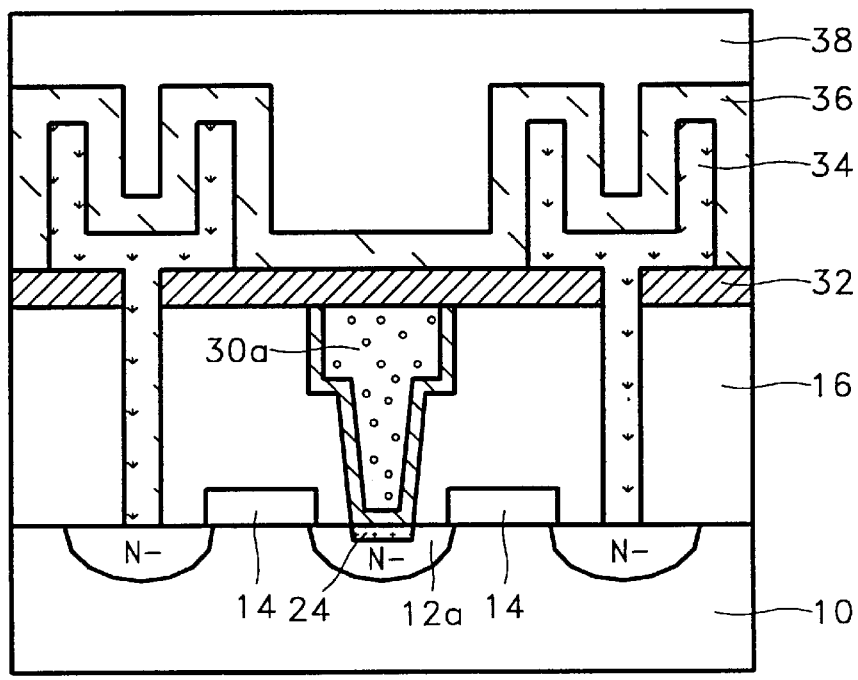
FIG. 8 is a cross-sectional view of a memory cell portion of a semiconductor device process substrate resulting from an interconnection process step, wherein a second insulating layer has been deposited upon the substrate which layer covers the upper electrode surface.
Figure 19:
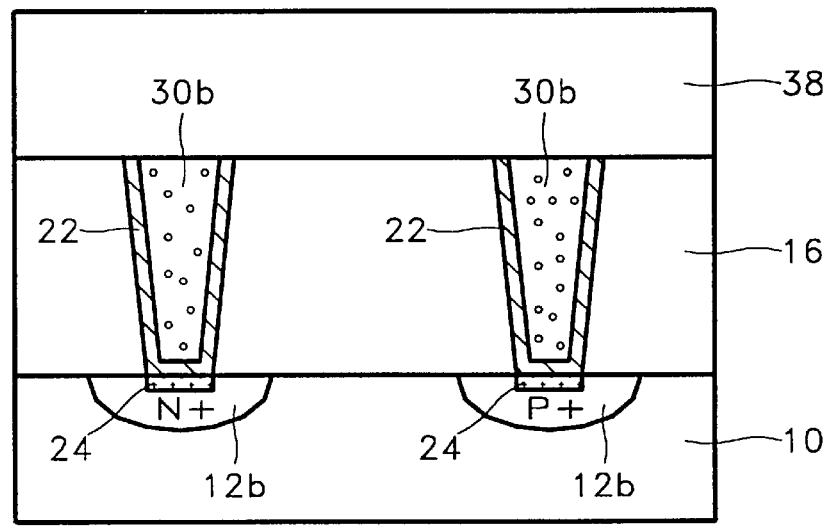
FIG. 19 is a cross-sectional view of a peripheral circuit portion of a semiconductor device process substrate resulting from an interconnection process step, wherein a second insulating layer has been deposited upon the substrate and the layer covers the top of the landing pad area.

Referring to FIGS. 8 and 19, a second insulating film 38 is deposited on the whole surface of the resultant structure.

Figure 9:
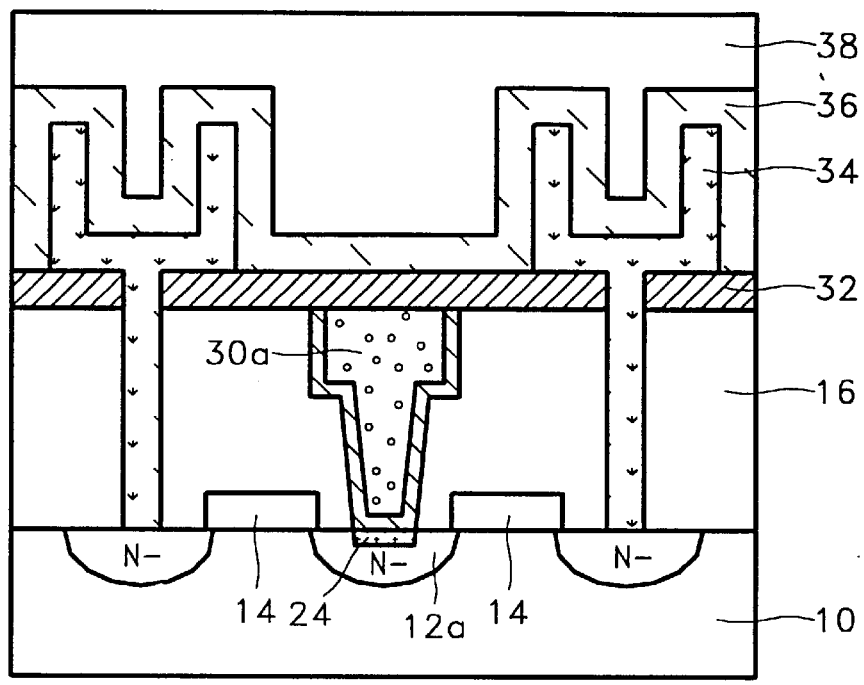
FIG. 9 is a cross-sectional view of a memory cell portion a semiconductor device process substrate resulting from an interconnection process step, corresponding to the step of FIG. 20.
Figure 20:
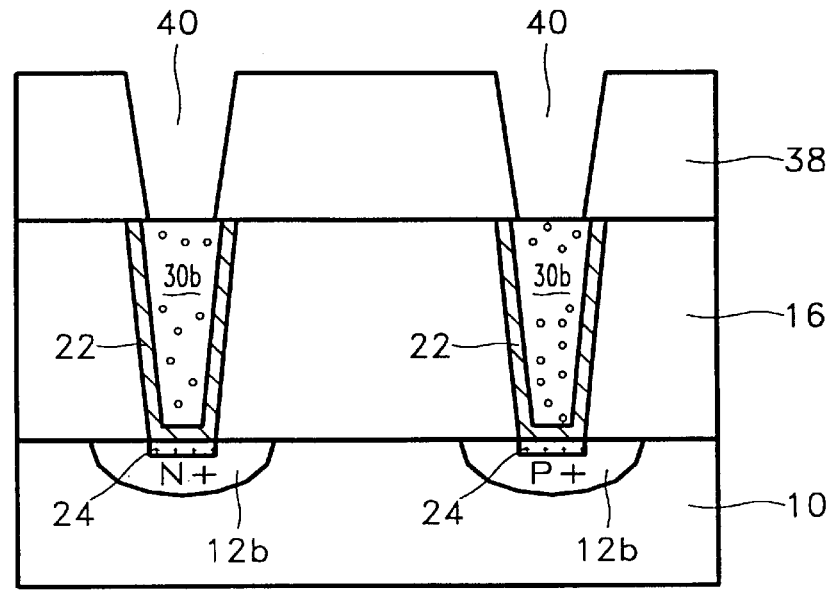
FIG. 20 is a cross-sectional view of a peripheral circuit portion of a semiconductor device process substrate resulting from an interconnection process step, wherein the second insulating film layer on the landing pad has been etched to produce a contact hole for an interconnection.

Referring to FIGS. 9 and 20, a contact hole 40 for interconnection is formed by etching second insulating film 38 on landing pad 30b formed on the peripheral portion.

Figure 10:
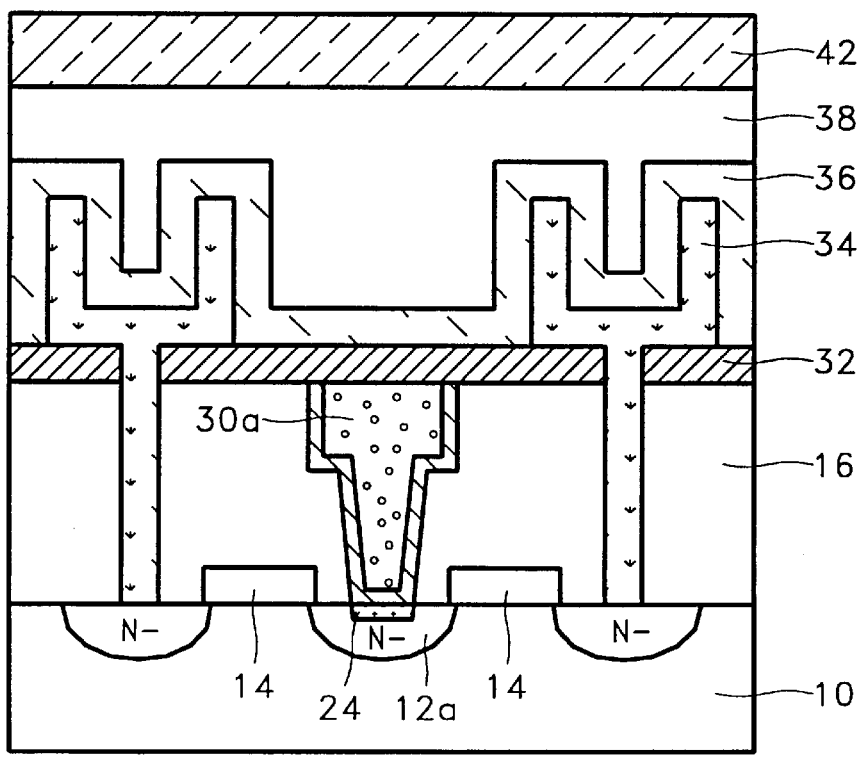
FIG. 10 is a cross-sectional view of a memory cell portion of a semiconductor device process substrate resulting from an interconnection process step, wherein a conductive metal layer is deposited on the surface of the substrate by a sputtering step.
Figure 21:
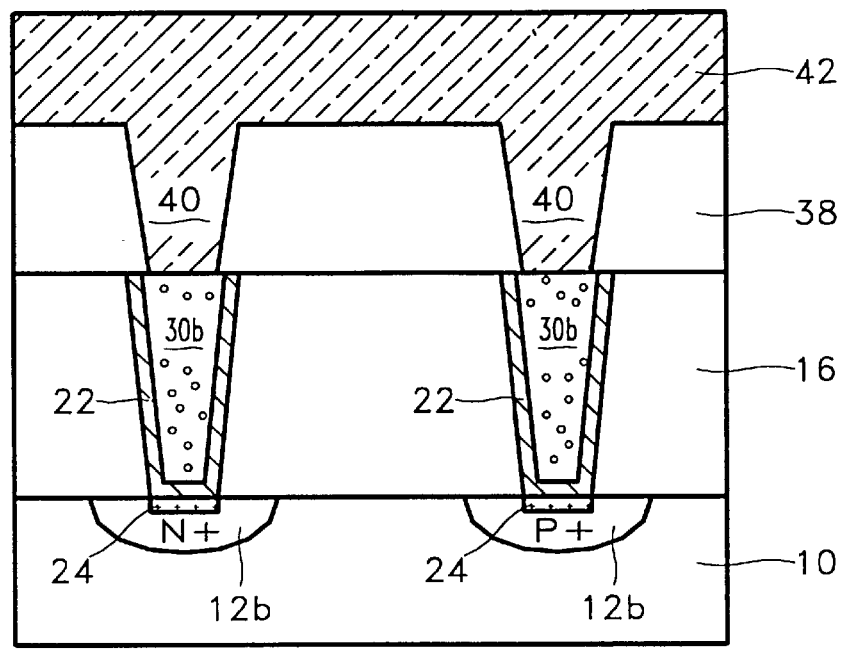
FIG. 21 is a cross-sectional view of a peripheral circuit portion of a semiconductor device process substrate resulting from an interconnection process step, wherein a conductive metal layer is deposited by a sputtering step onto the surface of the substrate and into the contact hole of the landing pad.

Referring to FIGS. 10 and 21, the oxidized refractory metal film of a surface of exposed landing pad 30b under contact hole 40 for interconnection is eliminated by sputtering etching (or the refractory metal film is eliminated, then a barrier metal is deposited). Further, a metal layer 42 for interconnection is formed by depositing Al having high conductivity on the whole surface of the resultant structure, to thereby fill contact hole 40 for interconnection. In this process step, metal layer 42 for interconnection can be formed of a metal such as Cu. Ag or Au, or a metal compound such as Al-Cu, Al-Si-Cu or Ag-Cu.

For filling contact hole 40 for interconnection with Al, an Al reflow method, a high temperature sputtering method or a chemical vapor deposition method can be used. In the present invention the Al reflow method is used for such a process step, but the other methods can be also used.

According to the Al reflow method, a compound of Al-Si-Cu is deposited to a thickness of 2,000 Å–6,000 Å below 100° C., then maintained at 0.6 times higher than the melting point of the Al, preferably at a higher temperature than 450° C., for 30–180 seconds in a vacuum state to induce the movement of metal atoms so that the contact hole 40 for interconnection is filled.

Accordingly, the peripheral circuit portion has a contact formed for interconnection by uniting landing pad 30b filled with the refractory metal (or a refractory metal compound) with the contact hole 40 which is filled with Al.

Figure 11:
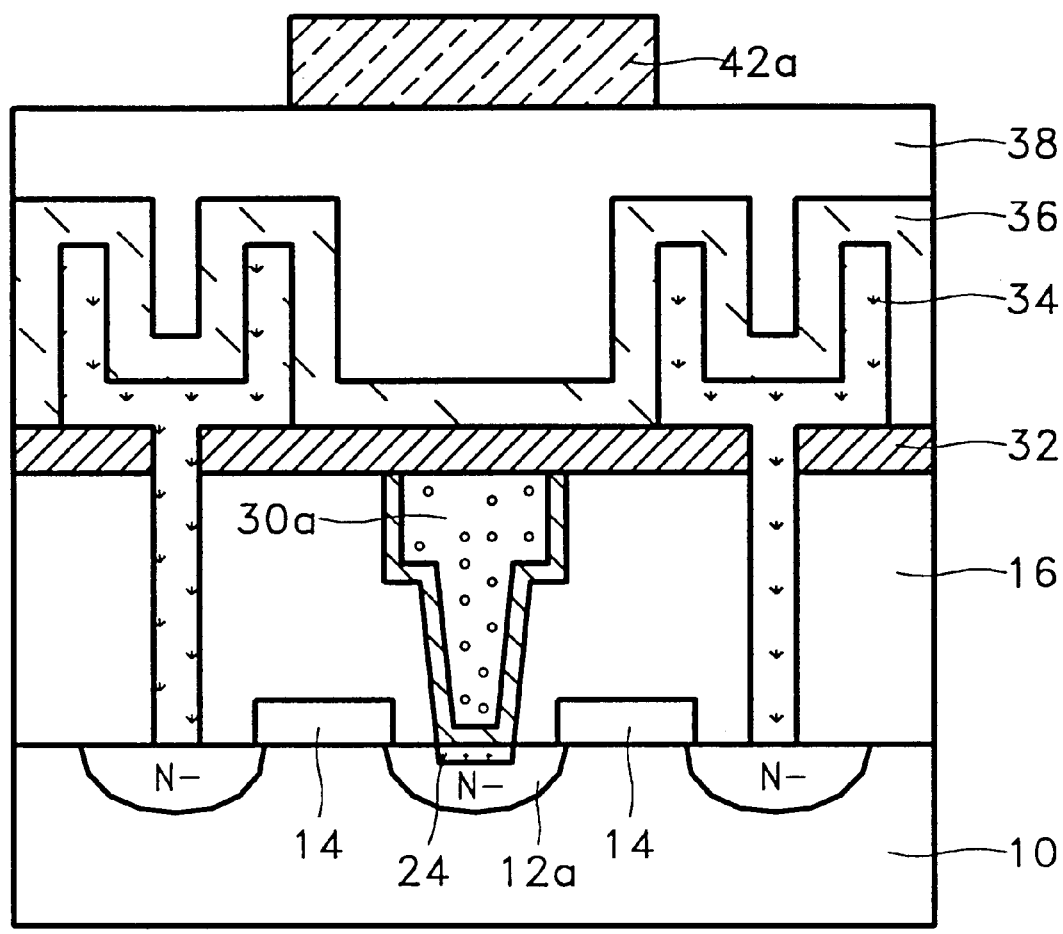
FIG. 11 is a cross-sectional view of a memory cell portion of a semiconductor device process substrate resulting from an interconnection process step, wherein the top surface of the substrate has been etched to remove part of the top metal layer for patterned interconnectivity.
Figure 22:
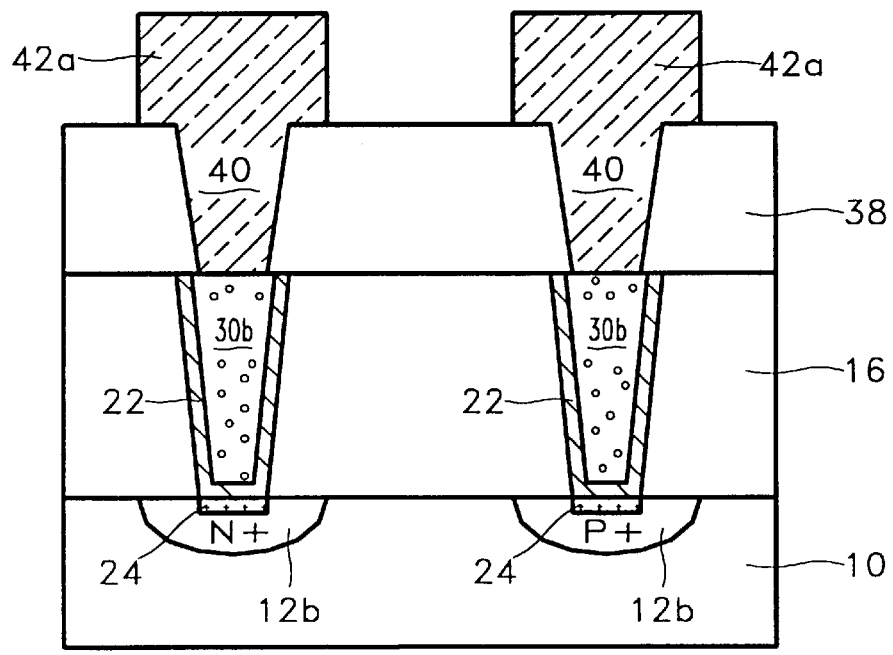
FIG. 22 is a cross-sectional view of a peripheral circuit portion of a semiconductor device process substrate resulting from an interconnection process step, wherein the top surface of the substrate has been etched to remove part of the top metal layer and form an interconnection line for patterned interconnectivity.

Referring to FIGS. 11 and 22, a metal layer 42 for interconnection is patterned by photolithography and etching, to thereby form an interconnection line 42a.

According to the method of form an interconnection of the present invention, when the bitline of the memory cell portion during manufacturing of the memory device is formed, in particular when a DRAM is formed, the landing pad which is filled with the refractory metal is concurrently formed on the peripheral circuit portion. Such a concurrent formation step has the effect of reducing the thickness of an insulating film that can be obtained during a successive step of forming a contact hole for interconnection. Therefore, it is easier to etch the contact hole for interconnection and a contact hole having a small aspect ratio is also formed on the landing pad.

Accordingly, the contact hole for interconnection is easily filled by the Al reflow method when forming a metal interconnection layer, further the coverage-step of depositing a metal on the contact hole for interconnection is enhanced, contact resistance is reduced. Thus, the reliability of the semiconductor device is increased.

It should be understood that the invention is not limited to the illustrated embodiment and that many changes and modifications can be made within the scope of the present invention by a skilled person in the art.

What is claimed is:

1. A method of forming an interconnection in a semiconductor device having a memory cell portion and a peripheral circuit portion comprising the steps of:
   a) forming an active region of said memory cell portion, forming an active region of said peripheral portion and forming a gate electrode on a silicon substrate, and then depositing a first insulating film on the whole surface of said resultant substrate structure;
   b) forming a recess structure connected to said active region of said memory cell portion and a contact hole for landing pad formation, which is connected to said active region of said peripheral circuit portion, by etching said first insulating film;
   c) depositing a metal film for ohmic contact on the whole surface of a substrate resulting from said step b);
   d) depositing a metal compound film for a diffusion barrier on the whole surface of a substrate resulting from said step c);
   e) depositing a metal material film on the whole surface of a substrate resulting from said step d), and then filling said recess structure and said contact hole for landing pad formation;
   f) forming a bitline and a landing pad by eliminating from said substrate said metal compound film and said metal material film excepting for films in said recess structure and said contact hole, which are filled with said metal material film for bitline and landing pad formation;
   g) depositing a second insulating film on the whole surface of a resultant of said step f);
   h) forming a contact hole for interconnection by etching said second insulating film on said landing pad;
   i) depositing a metal for interconnection on the whole surface of a resultant of said step h), and then filling said contact hole for interconnection; and
   j) forming an interconnection by patterning said metal for interconnection.

2. A method of forming an interconnection in a semiconductor device according to claim 1, wherein after said step a), the process further comprises a step of depositing spin on glass (SOG) on the whole surface of said first insulating film and then eliminating said SOG and a part of said first insulating film by a full etchback method.

3. A method of forming an interconnection in a semiconductor device according to claim 1, wherein said first insulating film of said step a) is formed of a material selected from a group consisting of borophosphosilicate glass (BPSG) and undoped $SiO_2$ glass (USG).

4. A method of forming an interconnection in a semiconductor device according to claim 1, wherein said first insulating film of said step a) is formed by chemical vapor deposition (CVD).

5. A method of forming an interconnection in a semiconductor device according to claim 1, wherein after said step c), the process further comprises a step of selectively forming an ohmic contact layer on the surface of said silicon substrate by reacting said metal film for ohmic contact with silicon and then stripping a non-reacted part of said metal film for ohmic contact.

6. A method of forming an interconnection in a semiconductor device according to claim 1, wherein said recess structure of said step b) is formed by etching said first insulating film in multiple stages.

7. A method of forming an interconnection in a semiconductor device according to claim 1, wherein said recess structure and said contact hole for landing pad formation of said step b) are simultaneously formed on a P-type and an N-type of said active region.

8. A method of forming an interconnection in a semiconductor device according to claim 1, wherein said metal film for ohmic contact of said step c) is formed of a member selected from the group consisting of Ti, W, Mo, Ta and Zr.

9. A method of forming an interconnection in a semiconductor device according to claim 1, wherein said metal film for ohmic contact of said step c) is formed by sputtering.

10. A method of forming an interconnection in a semiconductor device according to claim 1, wherein said metal compound film for a diffusion barrier is formed of a member selected from the group consisting of TiN, WN, TaN, ZrN, TiC, WC, TaC and ZrC.

11. A method of forming an interconnection in a semiconductor device according to claim 1, wherein said metal material film of said step e) is formed of a member selected from the group consisting of W, Mo, Ta, Ti, Zr, nitride and carbide.

12. A method of forming an interconnection in a semiconductor device according to claim 1, wherein said metal material film of said step e) is formed by CVD.

13. A method of forming method of an interconnection in a semiconductor device according to claim 1, wherein said step f) of eliminating a metal compound film and a metal material film is performed by chemical mechanical polishing or plasma full etchback.

14. A method of forming an interconnection in a semiconductor device according to claim 1, wherein said metal for interconnection of said step i) is member selected from the group consisting of Al, Au, Cu, Ag, an Al-Cu compound, an Al-Si-Cu compound and an Ag-Cu compound.

15. A method of forming an interconnection in a semiconductor device according to claim 1, wherein said step i) of filling said contact hole for interconnection is performed by a member selected from the group consisting of an aluminum reflow method, a high temperature sputtering method, and a chemical vapor deposition method.

* * * * *